United States Patent
Chen et al.

(10) Patent No.: US 9,231,015 B2
(45) Date of Patent: Jan. 5, 2016

(54) BACKSIDE-ILLUMINATED PHOTOSENSOR ARRAY WITH WHITE, YELLOW AND RED-SENSITIVE ELEMENTS

(71) Applicant: OmniVision Technologies, Inc., Santa Clara, CA (US)

(72) Inventors: Gang Chen, San Jose, CA (US); Duli Mao, Sunnyvale, CA (US); Dyson Hsinchih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 437 days.

(21) Appl. No.: 13/625,458

(22) Filed: Sep. 24, 2012

(65) Prior Publication Data

US 2014/0084135 A1  Mar. 27, 2014

(51) Int. Cl.
*H04N 5/222* (2006.01)
*H01L 27/146* (2006.01)
*H04N 5/225* (2006.01)
*H04N 5/376* (2011.01)
*H04N 5/247* (2006.01)
*H01L 31/101* (2006.01)
*H01L 31/09* (2006.01)

(52) U.S. Cl.
CPC ...... *H01L 27/14645* (2013.01); *H01L 27/1464* (2013.01); *H04N 5/222* (2013.01); *H01L 31/09* (2013.01); *H01L 31/1013* (2013.01); *H04N 5/2251* (2013.01); *H04N 5/247* (2013.01); *H04N 5/376* (2013.01)

(58) Field of Classification Search
CPC .............. H01L 31/09; H01L 31/1013; H01L 27/14647; H01L 27/14645; H01L 27/14667; H01L 27/14621; H01L 31/02162
See application file for complete search history.

(56) References Cited

U.S. PATENT DOCUMENTS

| 4,011,016 | A | 3/1977 | Layne et al. |
| 4,238,760 | A | 12/1980 | Carr |
| 7,741,666 | B2 | 6/2010 | Nozaki et al. |

(Continued)

FOREIGN PATENT DOCUMENTS

| TW | 200836334 A | 9/2008 |
| WO | 02/27804 A2 | 4/2002 |

OTHER PUBLICATIONS

Honda, Hiroto, et al; "A Color CMOS Imager With 4 X 4 White-RGB Color Filter Array For Increased Low-Illumination Signal-to-Noise Ratio," IEE Transaction on Electron Devices, vol. 56, No. 11, pp. 2398-2402, Nov. 2009.
Taiwanese Patent Application 102131074 Office Action dated Jan. 27, 2015, 7 pages.

*Primary Examiner* — Francis M Legasse, Jr.
(74) *Attorney, Agent, or Firm* — Lathrop & Gage LLP

(57) ABSTRACT

A monolithic backside-sensor-illumination (BSI) image sensor has a sensor array is tiled with a multiple-pixel cells having a first pixel sensor primarily sensitive to red light, a second pixel sensor primarily sensitive to red and green light, and a third pixel sensor having panchromatic sensitivity, the pixel sensors laterally adjacent each other. The image sensor determines a red, a green, and a blue signal comprising by reading the red-sensitive pixel sensor of each multiple-pixel cell to determine the red signal, reading the sensor primarily sensitive to red and green light to determine a yellow signal and subtracting the red signal to determine a green signal. The image sensor reads the panchromatic-sensitive pixel sensor to determine a white signal and subtracts the yellow signal to provide the blue signal.

6 Claims, 5 Drawing Sheets

(56) References Cited

U.S. PATENT DOCUMENTS

| | | | |
|---|---|---|---|
| 2007/0201738 A1* | 8/2007 | Toda et al. | 382/144 |
| 2008/0068475 A1* | 3/2008 | Choe et al. | 348/273 |
| 2010/0109060 A1 | 5/2010 | Mao et al. | |
| 2010/0258893 A1* | 10/2010 | Sawada | 257/440 |

* cited by examiner

BACKSIDE-ILLUMINATED PHOTOSENSOR ARRAY WITH WHITE, YELLOW AND RED-SENSITIVE ELEMENTS

FIELD

The present application relates to the art of semiconductor array photosensors, and in particular to the art of backside-sensor-illumination photosensor arrays as used on image sensor integrated circuits.

BACKGROUND

Photosensor arrays are commonly used in electronic cameras, including both still and video cameras. These photosensor arrays are often incorporated as components of image sensor integrated circuits along with circuitry for reading images from the photosensor array. Typically, these devices are integrated circuit die having a rectangular array of pixel sensors, where each pixel sensor includes at least one photodiode or phototransistor adapted for detecting light, together with circuitry for sensing the sensors to generate an electronic signal representing light detected by the sensors, and for exporting that signal to off-chip circuitry. Most such photosensors are of the topside-illumination type, designed to receive light into the pixel sensors through the same die surface into which controlling transistors, including transistors of the sensing and signal exporting circuitry, are built.

While photosensor arrays may be of the "black and white" type, often used for security cameras, in 2012 most video and still camera applications demand color.

A common type of color photosensor array has color filters deposited over topside-illuminated pixel sensors. These filters are often in a four-pixel, three-color, pattern that is repeated, or tiled, throughout the array; the filters in such arrays are typically colored such that one filter admits red light to a first sensor, another admits green light to a second sensor, another admits blue light to a third pixel sensor, and the fourth filter of each pattern admits one of red, green, or blue light to a fourth pixel sensor.

In many camera systems, outputs of the pixel sensors from the patterns are processed to provide traditional red, green, and blue (RGB) color signals, such as may be used in an additive color display system to provide a full-color image. Red-Green-Blue has become the standard for color electronic cameras and color computer monitor video.

In recent times, backside-illuminated (BSI) photosensor arrays have been developed. These photosensor arrays typically are built on thinned die, with controlling transistors on a first surface of the die, but designed to receive light through a second, or backside, surface of the die opposite the first surface.

While some BSI photosensors use a pattern of filters printed onto the backside surface to selectively admit red, green, or blue light to sensors of each tiled pattern, it has been found that pixel sensors can be designed to have color response determined by junction profiles and depths in the sensors. In FIG. 1 of US published patent application PCT/US01/29488, a color photosensor array is described having a pixel sensor with three photodiode junctions stacked vertically, one on top of each other, with one deep junction, of depth about 2 microns, sensing red light, another intermediate-depth junction, of depth about 0.6 microns, sensing green light, and another shallow junction, of depth about 0.2 microns, sensing blue light.

SUMMARY

A monolithic backside-sensor-illumination (BSI) image sensor has a sensor array tiled with-multiple-pixel cells having a first pixel sensor primarily sensitive to red light, a second pixel sensor primarily sensitive to both red and green (known herein as "yellow light") light, and a third pixel sensor having panchromatic sensitivity, the pixel sensors laterally adjacent each other. In a particular embodiment, the primary spectral sensitivity of each pixel sensor is determined by junction depths of the photodiode portion of each sensor. The image sensor determines a red, a green, and a blue signal comprising by reading the red-sensitive pixel sensor of each multiple-pixel cell to determine the red signal, reading the sensor primarily sensitive to red and green light to determine a yellow signal and subtracting the red signal to determine a green signal. The image sensor reads the panchromatic-sensitive pixel sensor to determine a white signal and subtracts the yellow signal to provide the blue signal.

DETAILED DESCRIPTION OF THE EMBODIMENTS

Structure of the Photosensor Array

As light enters a surface of a silicon photosensor, shorter wavelengths tend to be absorbed closer to the surface, with longer wavelengths at greater depths in the surface. This means that blue light is absorbed closest to the surface, with green and yellow at greater depths, and red absorbed at deeper levels.

Figure 1:
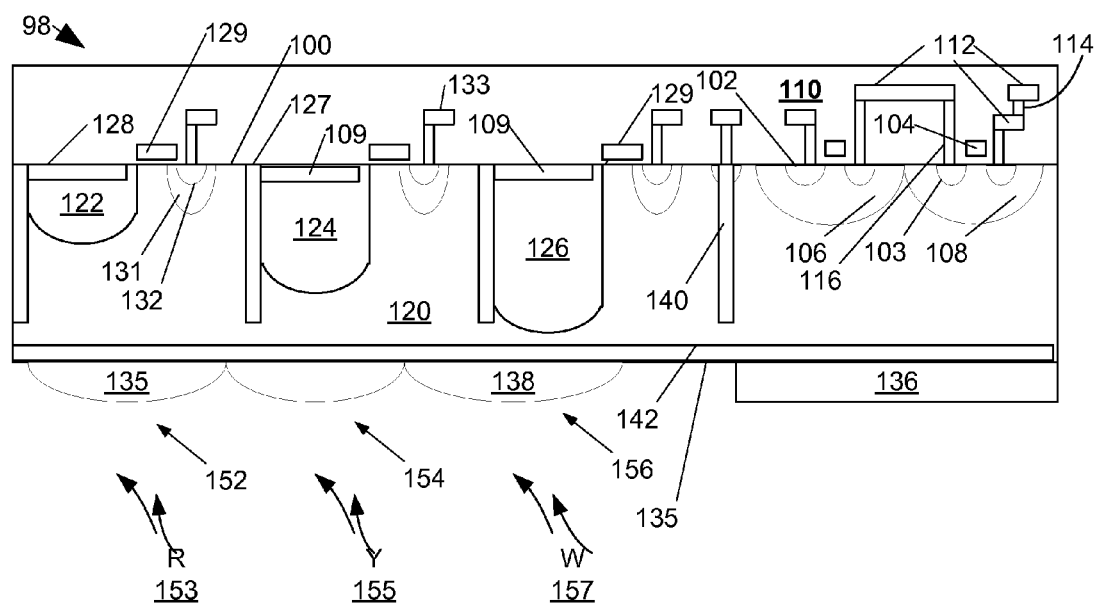
FIG. 1 is a schematic cross-sectional diagram showing a red, a yellow, and a white-sensitive pixel sensor of a photosensor array.
Figure 2:
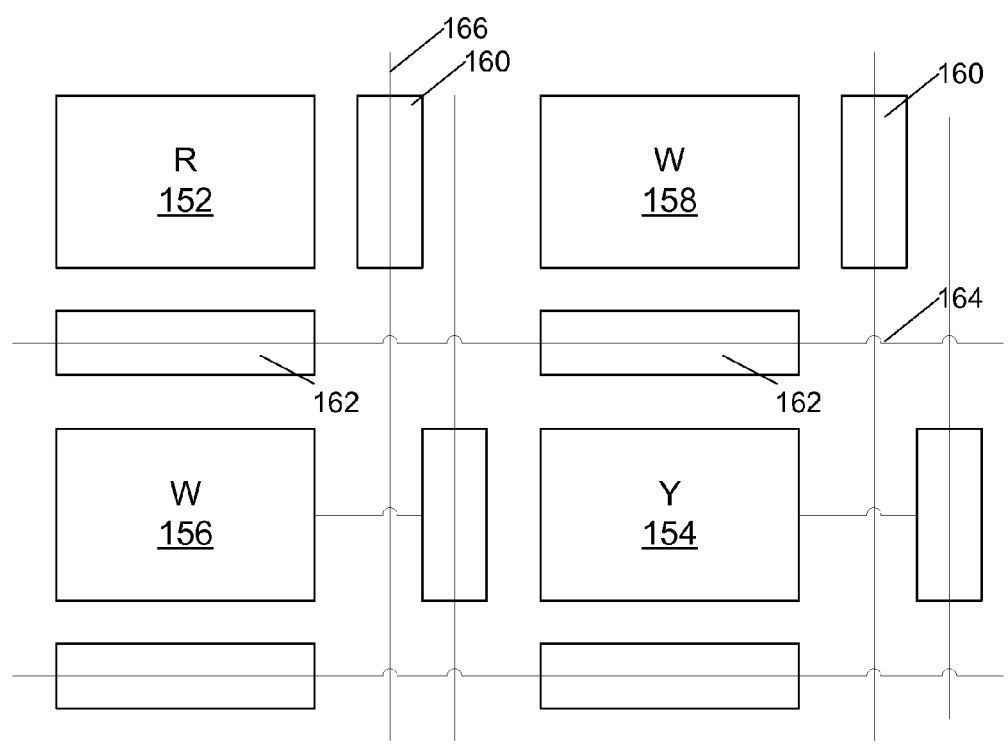
FIG. 2 is a schematic plan view illustrating a four-pixel cell having one red, one yellow, and one white pixel sensor, and one pixel sensor selected from red, yellow, and white.

A photosensor array 98, optimized for backside illumination, is constructed in a semiconductor wafer, in a particular embodiment the semiconductor wafer is a silicon wafer. Specific photosensors, without associated electronics, of this array are illustrated in cross section in FIG. 1; FIG. 2 illustrates a top view of a repeating, or tiled unit, portion of this array. The photosensor array has a first or top surface 100 into which diffused areas 102, 103 forming parts of silicon-gate metal-oxide-semiconductor (MOS) transistors are formed. On this first surface is grown a gate oxide, and on the gate oxide is deposited gate material 104, which in an embodiment is polysilicon gate material; thresholds of these MOS transistors are adjusted as known in the art with an ion implant. In an embodiment, both N and P channel transistors are formed. In a particular embodiment, P-channel transistors are formed having P-type source and drain implanted regions 102 in N well 106; and N-channel transistors are formed having N-type source and drain implanted regions 103 in P wells 108. On this top surface 100, is also deposited one or more layers of dielectric oxide 110, together with one or more layers of interconnect metal 112. Vias 114, providing patterned interconnects between metal 112 layers, and contacts 116, providing patterned interconnects between lower metal 112 and diffused areas 102, 103, are also provided within dielectric 110 on top surface 100, as known in the art of multilayer-metal, silicon-gate, CMOS, integrated circuit fabrication. The transistors are used for decoding, driving, precharging or resetting, sensing, and reading photosensors of the photosensor array, and for other purposes A portion of photosensor array 98 is allocated to photosensors 152, 154, 156. Each photosensor is formed in a P-epitaxial layer of the first surface 100 of the semiconductor wafer by forming an N− region 122, 124, 126 that serves as a photodiode. The N− region is capped with a surface P+ cap region 128, and may have P+ isolation sidewalls 127 for isolating it from adjacent N− regions and areas having transistors. Each N− photodiode region is also associated with an adjacent selection-transistor gate 129, a P well region 131 provided for threshold adjustment, and a drain diffusion 132. Drain diffusion 132 may in some embodiments be coupled to a column sense line 133.

The semiconductor wafer is thinned to permit at least some light 153, 155, 157 incident upon the second or backside surface 135 of the wafer to reach the N− photodiode regions 122, 124, 126.

Portions of the photosensor array integrated circuit that have decoding, driving, sense-amplifier, multiplexing, and other CMOS circuitry may be shielded from ambient light 153, 155, 157 by a patterned opaque coating 136. This coating has openings to permit incident light 153, 155, 157 to reach the surface in portions having photosensors, and is present to define, and prevent light from reaching, regions where it is undesirable for light to reach the photosensor array because such light may affect circuit performance, such as in decoders, sense amplifiers, and analog or digital-signal processors that may be on the same die as the photosensor array. Microlenses 138 may be formed on second surface 135 to concentrate light reaching second surface 135 on photodiode regions 122, 124, 126.

The N− photodiode regions 122, 124, 126 are each of depth selected from a shallow, red-sensitive absorber depth, such as region 122, a deeper red-and-green (yellow) sensitive absorber depth such as region 124, and a still-deeper, white or panchromatic-sensitive absorber region depth, such as region 126.

Additional P+ regions, such as guardrings or diode-contact regions 140, may be provided to isolate transistor circuitry regions from photosensor regions of the array, and there may also be a buried P+ impedance-reduction region 142.

Photosensor arrays as herein described do not need a color filter array printed on the backside surface 135 having different light transmission and absorption properties for one or more pixels of the array than for other pixels of the array. Such color filter arrays printed on the backside surface, the side from which light is admitted to the array, are required on photosensor arrays where each photosensor has the same optical properties.

Fabrication by Implantation of N− Photodiode Absorber Region

In an embodiment the N− photodiode absorber region 122, 124, 126, has depth determined through an ion implant, where depth is controlled through selection of ion beam energy provided by an ion implanter, this energy is measured in effective acceleration voltage. In an embodiment where the absorber regions 122, 124, 126 are fabricated by ion implantation, for each particular depth of the absorber region, a photoresist is applied to the first surface of the wafer, exposed, and developed to provide a layer of photoresist patterned with openings where the second diffused region is desired at that particular depth; the wafer is then implanted by exposing its surface to an ion beam of an energy determined to produce an absorber region extending to that particular depth in the ion implanter as known in the art of integrated circuit manufacture, and the remaining resist is removed. The steps of applying a photoresist, exposing and developing the photoresist, and implanting are then repeated with different implanter beam energy to produce additional second diffused regions at different depths.

In a particular embodiment, peak implant energies used are 1 MV for panchromatic or white-sensitive, 500 kV for yellow-sensitive, and 250 kV for red-sensitive implants in a silicon substrate, with the 250 kV implants producing an absorber regions at a depth of less than half a micron, and the 500 kV implant producing an absorber region at a depth of less than two microns. Since high-voltage implants may send most ions deep enough to leave the surface un-inverted while creating an inverted N− region below the surface, implants may be superimposed. For example a deep absorber region 126 may receive implants at both 1 MV and 250 kV, or at all three energies 1 MV, 500 kV, and 250 kV, or at additional energies between zero and 1 MV, as necessary to produce a desired doping profile and may extend the absorber region from that depth towards the first surface to the surface or to a base of an overlying cap diffusion 109. Similarly, an intermediate absorber region 124 may receive implants at 250 kV as well as at 500 kV, or at additional energies between zero and 500 kV. For purposes of this document, an absorber region extending to a depth below the first surface is one that has been a boundary between an N or P type of the absorber region and a complimentary P or N type of surrounding material at that depth, and may have the same N or P type extending from that depth to a point at or near the first surface. Photosensors as herein described may also be fabricated in other semiconductor materials such as silicon carbide, gallium arsenide, or germanium, but will require different beam energies and junction depths than those beam energies used for silicon.

The term wavelength-determining implant as used herein shall mean the implant that determines depth of the lowest part of the absorber region 122, 124, 126, and therefore a depth of the active photodiode region.

Fabrication by Epitaxy and Dopant Application

In alternative embodiments, depth of the absorber region is determined in alternative ways, in a particular alternative embodiment where the lightly-doped absorber regions are grown epitaxially on a substrate, this epitaxial growth being interrupted first to apply a dopant to particular areas at a deep depth to form a deep diffused region 126, then the epitaxial growth is continued and interrupted second to apply a dopant to particular areas at an intermediate depth to form an intermediate diffused region 124, then the epitaxial growth is continued and interrupted again to apply a dopant to particular areas at a shallow depth to form a shallow buried diffused region 122.

Thinning

Once the photosensors, associated circuitry, and other circuitry has been formed in the wafer on the first surface, but prior to forming opaque mask regions 136 and microlenses 138, the opposing or second surface 135 of the wafer is thinned to permit light arriving at the second, or backside, surface to reach the photodiodes of the array as known in the art of backside-illuminated (BSI) silicon array photosensors. Pixels, or photosensors, 152 having a shallow absorber region 122 will primarily respond to red light 153, since shorter-wavelength light (such as blue light) is absorbed in that portion of the wafer that lies between the shallow absorber region 122 and the second surface 135. Similarly, pixels 154 having an intermediate-depth absorber region 124 will primarily respond to red and yellow light 155, because blue light is absorbed in that portion of the wafer that lies between the absorber region 122 and the second surface 135. Finally, pixels 156, 158 having deep absorber regions 126 respond to all wavelengths of light 157, including blue light, and are considered white-light sensitive. Photosensors sensitive to all wavelengths of visible light are also known as panchromatic sensors.

An infrared-absorbing filter, or other filter having uniform absorption characteristics for all pixels or photosensors of the array, may in some embodiments be deposited on the second surface 135; in some embodiments this filter lies between second surface 135 and the microlenses 138, and in other embodiments it lies on top of microlenses 138.

Tiling Patterns

Photosensors of the array are organized in a repeating, or tiled, cell having four or more photosensors; an embodiment having a four-photosensor tiled cell is illustrated in FIG. 2. In this tiled cell, at least one of each red-sensitive 152, yellow-sensitive 154, and white-sensitive 156 pixel photosensors are positioned laterally adjacent each other. A fourth photosensor is provided in the cell and in embodiments is selected from a photosensor of the red, yellow, or white-sensitive type. For optimum low-light sensitivity, the fourth photosensor 158 is an additional photosensor of the white-sensitive type. Column 160 and row 162 circuitry, using one or more transistors formed in first surface of the wafer, is provided for addressing each photosensor through row lines 164 and interfacing the photosensors to column lines 166 as known in the art of array photosensors. In some embodiments, separate column lines are provided for each photosensor of the tiled cell to permit reading all four photosensors simultaneously. In some embodiments having a row memory for color recovery, column lines may be shared between rows of the tiled cell.

Figures 3A, 3B, 3C, 3D, 3E, 4:
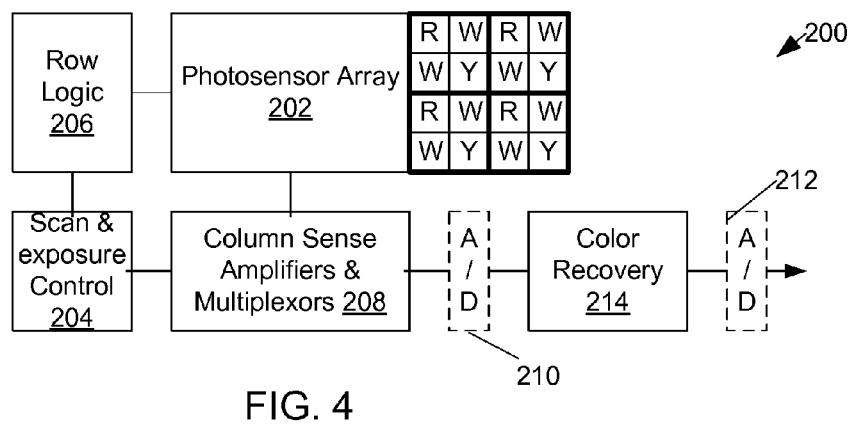
FIG. 3A illustrates a 4-pixel tiling pattern having two red, one yellow, and one white-sensitive sensors.
FIG. 3B illustrates a 4-pixel tiling pattern having one red, one yellow, and two white-sensitive sensors.
FIG. 3C illustrates a 4-pixel tiling pattern having one red, two yellow, and one white-sensitive sensors.
FIG. 3D illustrates a 9-pixel tiling pattern having two red, one yellow, and six white-sensitive sensors.
FIG. 3E illustrates a 16-pixel tiling pattern.
FIG. 4 is a block diagram of a backside-illuminated image sensor circuit having tiled cells according to FIGS. 1 and 2 in its photosensor array.

FIG. 2 illustrates just one of several possible tiling patterns. Four-pixel tiling patterns are illustrated in FIGS. 3A, 3B, and 3C. FIG. 3A illustrates a 4-pixel tiling pattern having two red, one yellow, and one white-sensitive sensors. FIG. 3B illustrates a 4-pixel tiling pattern having one red, one yellow, and two white-sensitive sensors. FIG. 3C illustrates a 4-pixel tiling pattern having one red, two yellow, and one white-sensitive sensors.

Many image sensors are used in television applications, where an effective bandwidth or resolution of color information is often much less than a bandwidth or resolution of luminance—or black and white information. For these applications, tiling patterns having more than four pixels may suffice, so long as each repeated pattern has at least one sensor of each of the red, yellow, and white-sensitive types. For example, FIG. 3D illustrates a 9-pixel tiling pattern having two red, one yellow, and six white-sensitive sensors, and FIG. 3E illustrates a 16-pixel tiling pattern.

An image sensor integrated circuit 200 (FIG. 3), has a photosensor array 202 tiled with a pattern of pixel sensors as described above with reference to FIG. 1 and FIG. 2. The image sensor circuit 200 includes scan and exposure control circuitry 204, which includes row and column counters for addressing pixel sensors of the array in a determined sequence. An output of the row counter of scan and exposure control 204 is decoded by row logic 206 to provide row selection for the photosensor array 202. Photosensors of each selected row are coupled to column sense amplifiers and multiplexors 208, such that signals representing light received by a sequence of pixels, or a sequence of tiling patterns, is provided; these signals incorporate red, yellow, and white information.

Sensing Light

In operation, a bias is applied to each photodiode of each sensor during a precharge phase by a reset or precharge device that may be part of the row logic 206, and may make use of selection gate 129. Light received through second surface 135 and absorbed in absorber region 122, 124, 126 causes minority carrier production in those regions that provides leakage across junctions of the photodiode. After an exposure time, remaining charge on the photodiode of each sensor is measured, in a particular embodiment by coupling sensors through devices of row logic 206 through column lines 166 to sense amplifiers, not shown, to generate signals representing light received by each sensor.

Signals representing light received by a sequence of pixels, or a sequence of tiling patterns, may in an embodiment be digitized by an analog to digital converter 210 prior to color recovery. In an alternative embodiment, digitization is performed by an analog to digital converter 212 after color recovery to provide a digital image signal for further processing. In either embodiment, a color recovery processor 214 is provided to translate the red, yellow, and white information derived from the photosensors into red, green, and blue information corresponding to that provided by traditional image sensors.

Color Recovery

Figure 5:
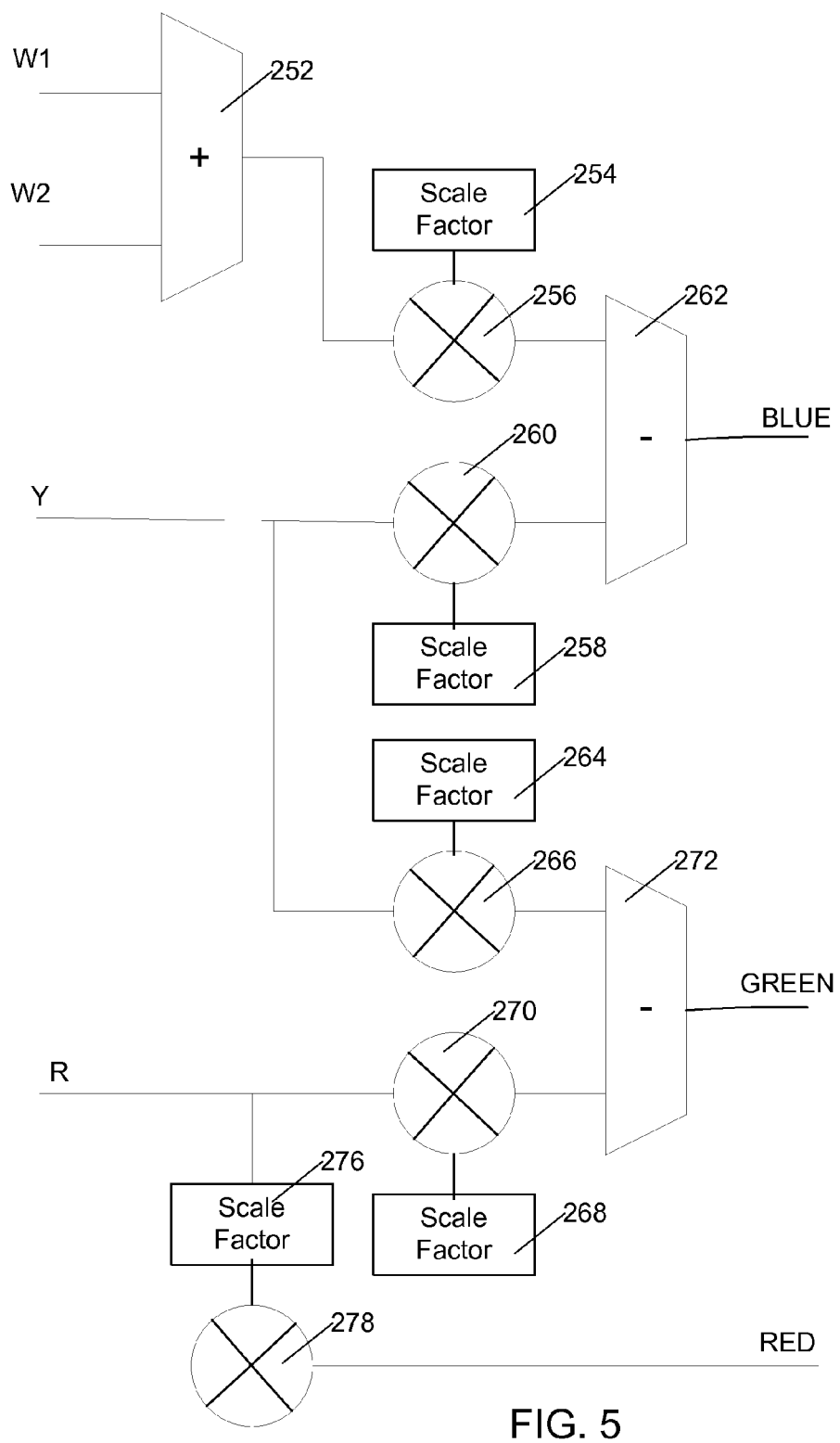
FIG. 5 is a block diagram of a color-recovery unit for providing red, green, and blue intensities for each tiling unit of the type illustrated in FIGS. 3B and 2.

A block diagram of a color-recovery processor 214 for providing red, green, and blue information for each tiling pattern as illustrated in FIG. 2 or FIG. 3B is provided in FIG. 5. If provided ahead of analog-to-digital converter 212, this unit is constructed of analog multipliers and summing amplifiers, if provided after analog-to-digital converter 210, this unit has digital array multipliers and binary adders. Two white signals, W1 and W2, representing light received by photosensors 156 and 158, are summed by adder or summing amplifier 252 to provide twice an average white level, which is then multiplied by a white scale factor 254 in multiplier 256 to give a scaled white level. The yellow sensor signal Y, representing photosensor 154, is similarly multiplied by a yellow scale factor 258 in multiplier 260 to give a scaled yellow level, the scaled yellow level is then subtracted from the scaled white level in adder or summer 262 to give a blue signal BLUE. This circuitry implements the equation BLUE=W*(W scale factor)−Y*(Y scale factor).

Similarly, the yellow signal Y is multiplied by a second yellow scale factor 264 in multiplier 266 to give a scaled white level. The red sensor signal R, representing photosensor 152, is similarly multiplied by a red scale factor 268 in multiplier 270 to give a scaled red level, the scaled red level is then subtracted from the scaled yellow level in adder or summer 272 to give a green signal GREEN. This circuitry implements the equation GREEN=Y*(Y scale factor)−R*(R scale factor).

The red signal R is then multiplied by a second red scale factor 276 in multiplier 278 to give a red signal RED. This circuitry implements the equation RED=R*(R scale factor)

Figure 6:
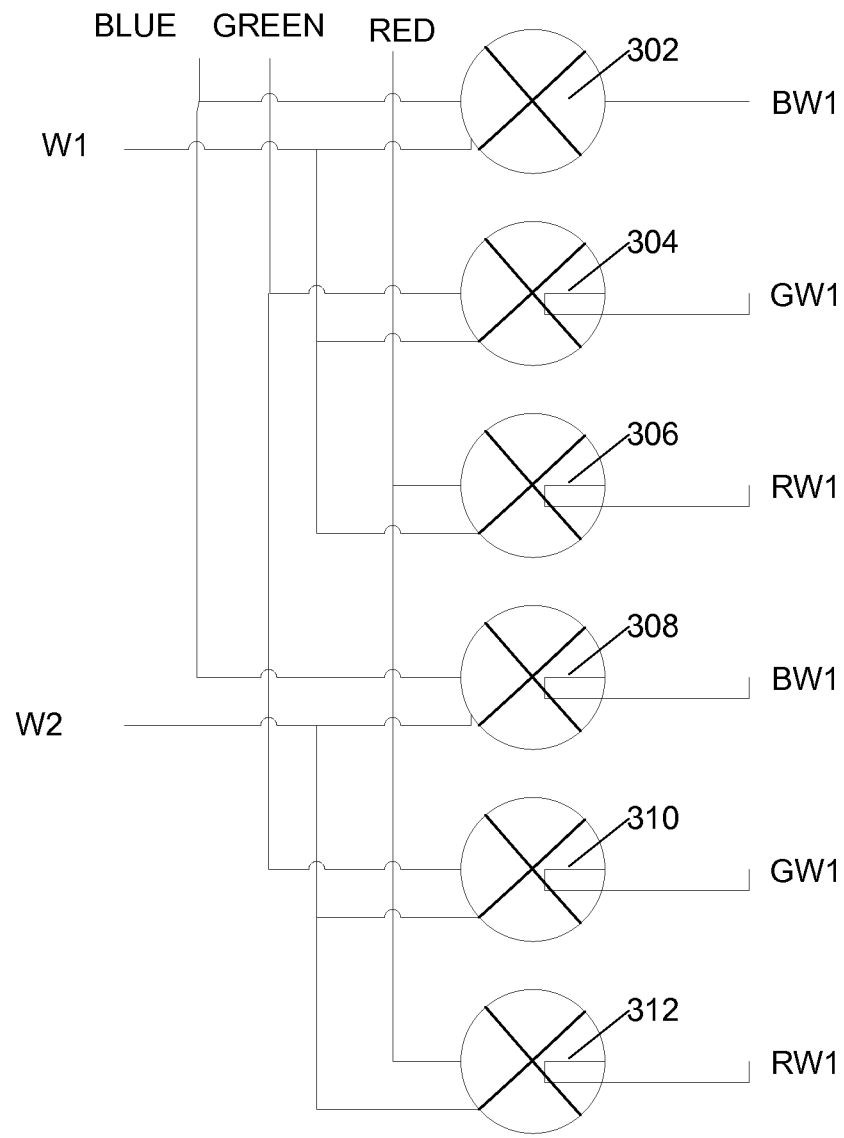
FIG. 6 is a block diagram of further color-recovery for providing individual red, green, and blue intensities for each pixel of a 4-pixel tiling pattern.

In some embodiments, a second stage of color processing, the RED, GREEN, and BLUE signals may be multiplied by raw white signals W1 and W2 to provide separate pixel red, green, and blue signals RW1, RW2, GW1, GW2, BW1, and BW2 by multipliers 302, 304, 306, 308, 310, 312 as illustrated in FIG. 6. Similarly, individual, artificial red, green, and blue values may be generated for pixels associated with the yellow (RY, GY, BY) and red (RR, GR, BR) photosensors 152, 154. This circuitry implements the equations:

$$RW1 = RED * W1$$

$$RW2 = RED * W2$$

$$GW1 = GREEN * W1$$

$$GW2 = GREEN * W2$$

$$BW1 = BLUE * W1$$

$$BW2 = BLUE * W2$$

In embodiments optimized for intensity resolution at the expense of color resolution, such as may be used for television where historically chrominance is allocated much less bandwidth than luminance, the RED, GREEN, and BLUE signals may optionally be averaged with RED, GREEN, and BLUE signals from adjacent tiling patterns prior to reconstruction of the individual pixel red, green, and blue signals. This average is then used to provide red, green, and blue signals for each pixel of the tiling pattern.

Modifications can be made to the invention in light of the above detailed description while remaining within the spirit and scope of this document. The terms used in the following claims should not be construed to limit the invention to the specific embodiments disclosed in the specification. It is intended that all matter contained in the above description drawings be interpreted as illustrative and not in a limiting sense. It is also to be understood that the following claims are to cover certain generic and specific features described herein.

What is claimed is:

1. A monolithic back-side-illuminated (BSI) photosensor array tiled with a plurality of a multiple-pixel cells, the multiple-pixel cell comprising a first pixel sensor primarily sensitive to red light, a second pixel sensor primarily sensitive to red and green light, and a third pixel sensor having panchromatic sensitivity, the pixel sensors of each multiple-pixel cell laterally adjacent each other, the photo sensor array further comprising apparatus for determining a green signal by subtracting a reading of the first pixel sensor from a reading of the second pixel sensor.

2. The photo sensor array of claim 1 wherein the reading of the first pixel signal is scaled prior to subtraction from the reading of the second pixel sensor.

3. The photo sensor array of claim 1 further comprising apparatus for determining a blue signal by subtracting a reading of the second pixel sensor from a reading of the third pixel sensor.

4. The photo sensor array of claim 2 wherein each pixel sensor has a wavelength-determining diffused absorber region, and wherein the first pixel sensor has the wavelength-determining absorber region extending to a first depth, the second pixel sensor has the wavelength-determining absorber region extending to a second depth, and the third pixel sensor has the wavelength-determining absorber region extending to a third depth, and where the first and second depth are not equal.

5. The photo sensor array of claim 4 wherein depth of the wavelength-determining diffusions is determined by an energy of a wavelength-determining implant.

6. The photosensor array of claim 4 wherein the photosensor array comprises silicon photosensors.

* * * * *